United States Patent
Parekhji et al.

(10) Patent No.: US 10,684,322 B2
(45) Date of Patent: Jun. 16, 2020

(54) SYSTEMS AND METHODS OF TESTING MULTIPLE DIES

(71) Applicant: TEXAS INSTRUMENTS INCORPORATED, Dallas, TX (US)

(72) Inventors: Rubin Ajit Parekhji, Bangalore (IN); Mahesh M. Mehendale, Bangalore (IN); Vinod Menezes, Bangalore (IN); Vipul K. Singhal, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/247,271

(22) Filed: Jan. 14, 2019

(65) Prior Publication Data

US 2019/0154755 A1 May 23, 2019

Related U.S. Application Data

(63) Continuation of application No. 15/130,429, filed on Apr. 15, 2016, now Pat. No. 10,180,454.

(30) Foreign Application Priority Data

Dec. 1, 2015 (IN) ............................ 6457/CHE/2015

(51) Int. Cl.
*G01R 31/26* (2020.01)
*G01R 31/28* (2006.01)
(Continued)

(52) U.S. Cl.
CPC ....... *G01R 31/2834* (2013.01); *G01R 1/0416* (2013.01); *G01R 1/06711* (2013.01); *G01R 31/2886* (2013.01); *G01R 31/318511* (2013.01)

(58) Field of Classification Search
CPC .. G01R 3/00; G01R 31/2601; G01R 1/07307; G01R 1/07314; G01R 1/0416;
(Continued)

(56) References Cited

U.S. PATENT DOCUMENTS

| | | |
|---|---|---|
| 5,059,899 A | 10/1991 | Farnworth et al. |
| 5,467,020 A | 11/1995 | Boyette, Jr. et al. |

(Continued)

FOREIGN PATENT DOCUMENTS

| | | |
|---|---|---|
| CN | 1117138 | 2/1996 |
| JP | 2016218639 A | 12/2016 |
| WO | 2015103076 A2 | 7/2015 |

OTHER PUBLICATIONS

International Search Report for PCT/US2018/025788 dated Aug. 23, 2018; 2 pages.
(Continued)

*Primary Examiner* — Jermele M Hollington
*Assistant Examiner* — Taqi R Nasir
(74) *Attorney, Agent, or Firm* — Michael A. Davis Jr.; Charles A. Brill; Frank D. Cimino (57) ABSTRACT

In a method of testing a semiconductor wafer including a scribe line and multiple dies, the method includes implementing a first landing pad on the scribe line, and implementing a first interconnect on the scribe line and between the first landing pad and a first cluster of the dies, thereby coupling the first landing pad to the first cluster of dies. The method also includes performing the testing of the first cluster of dies using automated test equipment (ATE) coupled to a probe tip by contacting the first landing pad with the probe tip, and applying an ATE resource to the first cluster of dies.

8 Claims, 8 Drawing Sheets

(51) Int. Cl.
*G01R 31/3185* (2006.01)
*G01R 1/04* (2006.01)
*G01R 1/067* (2006.01)

(58) Field of Classification Search
CPC ... G01R 1/07342; G01R 31/26; G01R 31/3696; G01R 31/2621
USPC .............. 324/765, 762.01, 762.05, 719, 437, 324/754.01, 755.01, 756.03, 758.01, 690, 324/696, 754.03
See application file for complete search history.

(56) References Cited

U.S. PATENT DOCUMENTS

| | | | | |
|---|---|---|---|---|
| 5,637,916 | A * | 6/1997 | Joshi | H01L 21/486 257/668 |
| 6,504,424 | B1 | 1/2003 | Heminger et al. | |
| 6,861,832 | B2 | 3/2005 | Perez | |
| 8,779,599 | B2 * | 7/2014 | Lin | H01L 25/0652 257/685 |
| 9,299,668 | B2 | 3/2016 | Bourgeat et al. | |
| 9,489,000 | B2 | 11/2016 | Caffee et al. | |
| 9,568,536 | B2 * | 2/2017 | Kumar Goel | G01R 31/2601 |
| 2002/0175696 | A1 * | 11/2002 | Bu | G01R 31/318505 324/750.02 |
| 2003/0062521 | A1 | 4/2003 | Jang et al. | |
| 2003/0219913 | A1 * | 11/2003 | Pourkeramati | G01R 31/2884 438/12 |
| 2007/0275539 | A1 * | 11/2007 | Rashid | G01R 31/2884 438/460 |
| 2009/0239316 | A1 | 9/2009 | Li | |
| 2009/0250792 | A1 * | 10/2009 | Liou | H01L 21/02348 257/620 |
| 2010/0277196 | A1 * | 11/2010 | Walsh | G01R 31/2851 324/754.11 |
| 2011/0050267 | A1 * | 3/2011 | Pagani | G01R 1/07307 324/756.03 |
| 2011/0156732 | A1 * | 6/2011 | Pagani | G01R 31/2884 324/750.16 |
| 2011/0316572 | A1 * | 12/2011 | Rahman | G01R 31/2853 324/754.03 |
| 2013/0043470 | A1 * | 2/2013 | Huang | H01L 23/562 257/48 |
| 2013/0062727 | A1 * | 3/2013 | Huang | H01L 23/3178 257/506 |
| 2013/0075725 | A1 | 3/2013 | Huang et al. | |
| 2016/0365378 | A1 * | 12/2016 | Chiang | H01L 23/485 |

OTHER PUBLICATIONS

International Search Report for PCT/US2016/064412 dated Mar. 30, 2017.
Chinese Office Action for Chinese Patent Application 201680065275.0 dated Feb. 3, 2020; 7 pages.

* cited by examiner

| | AUTOMATED TEST EQUIPMENT | |
|---|---|---|
| RESOURCE A 2 | RESOURCE A 2 | RESOURCE B 2 |
| CYCLE 1 | DUT 1 | |
| CYCLE 2 | | DUT 1 |
| CYCLE 3 | DUT 2 | |
| CYCLE 4 | | DUT 2 |
| CYCLE 5 | DUT 3 | |
| CYCLE 6 | | DUT 3 |

604 →

| | AUTOMATED TEST EQUIPMENT | |
|---|---|---|
| RESOURCE A 2 | RESOURCE A 2 | RESOURCE B 2 |
| CYCLE 1 | DUT 1 | DUT 2 |
| CYCLE 2 | | DUT 1 |
| CYCLE 3 | DUT 3 | DUT 4 |
| CYCLE 4 | | |
| CYCLE 5 | | DUT 3 |
| CYCLE 6 | | DUT 4 |

606 →

| | AUTOMATED TEST EQUIPMENT | |
|---|---|---|
| RESOURCE A 2 | RESOURCE A 2 | RESOURCE B 2 |
| CYCLE 1 | DUT 1 | DUT 2 |
| CYCLE 2 | DUT 3 | DUT 1 |
| CYCLE 3 | DUT 2 | DUT 3 |
| CYCLE 4 | DUT 4 | DUT 5 |
| CYCLE 5 | DUT 6 | DUT 4 |
| CYCLE 6 | DUT 5 | DUT 6 |

608 →

| | AUTOMATED TEST EQUIPMENT | |
|---|---|---|
| RESOURCE A 2 | RESOURCE A 2 | RESOURCE B 2 |
| CYCLE 1 | DUT 1 | DUT 3 | DUT 2 |
| CYCLE 2 | | DUT 2 | DUT 1 |
| CYCLE 3 | | | DUT 3 |
| CYCLE 4 | DUT 4 | DUT 6 | DUT 5 |
| CYCLE 5 | | DUT 5 | DUT 4 |
| CYCLE 6 | | | DUT 6 |

FIG. 6

12-PROBE TIP HEAD — 706a

| | 2<br>RESOURCE A | 2<br>RESOURCE B | 2<br>RESOURCE A | 2<br>RESOURCE B | 2<br>RESOURCE A | 2<br>RESOURCE B |
|---|---|---|---|---|---|---|
| CYCLE 1 | DUT 1 | DUT 1 | | DUT 2 | | |
| CYCLE 2 | | | DUT 2 | | DUT 3 | |
| CYCLE 3 | | | | | | DUT 3 |
| CYCLE 4 | DUT 4 | DUT 4 | | DUT 5 | | |
| CYCLE 5 | | | DUT 5 | | DUT 6 | |
| CYCLE 6 | | | | | | DUT 6 |

6-PROBE TIP HEAD — 706b

| | 2<br>RESOURCE A,B | 2<br>RESOURCE A,B | 2<br>RESOURCE A,B |
|---|---|---|---|
| CYCLE 1 | DUT 1 (A) | DUT 2 (B) | |
| CYCLE 2 | DUT 1 (B) | | DUT 3 (A) |
| CYCLE 3 | | DUT 2 (A) | DUT 3 (B) |
| CYCLE 4 | DUT 4 (A) | DUT 5 (B) | |
| CYCLE 5 | DUT 4 (B) | | DUT 6 (A) |
| CYCLE 6 | | DUT 5 (A) | DUT 6 (B) |

8-PROBE TIP HEAD — 708

| | 2<br>RESOURCE A | 2<br>RESOURCE B | 2<br>RESOURCE A | 2<br>RESOURCE B |
|---|---|---|---|---|
| CYCLE 1 | DUT 1 | DUT 2 | DUT 3 | |
| CYCLE 2 | | DUT 1 | DUT 2 | DUT 3 |
| CYCLE 3 | | | | |
| CYCLE 4 | DUT 4 | DUT 5 | DUT 6 | |
| CYCLE 5 | | DUT 4 | DUT 5 | DUT 6 |
| CYCLE 6 | | | | |

FIG. 7

SYSTEMS AND METHODS OF TESTING MULTIPLE DIES

CROSS-REFERENCE TO RELATED APPLICATION

This application is a continuation of U.S. patent application Ser. No. 15/130,429 filed Apr. 15, 2016, which claims priority to India Provisional Patent Application Serial No. 6457/CHE/2015 filed Dec. 1, 2015, the entireties of which are incorporated herein by reference.

BACKGROUND

Automated test equipment (ATE) includes multiple resources (e.g., analog resources and digital resources for test and measurement) that are applied to a device under test (DUT), such as a die or dies on a semiconductor wafer. The resources are applied through an interface including one or more probe heads, where each probe head includes multiple probe tips to provide an electrical contact to landing pads on the DUT.

Conventional multi-site testing throughput is limited because a total set of one type of ATE resources may be limited to N, where M resources of that type are required to test a die, resulting in the maximum number of dies that may be tested in parallel during each touch-down of the wafer probe being N/M. Further, N/M is an ideal maximum multi-site capability. In practice, the probe card that controls routing to the various probe heads and tips may further constrain the routing density and reduce the amount of possible connections between ATE resources and multiple dies, thereby reducing the attainable multi-site factor.

In addition to the limitations imposed on the multi-site factor by physical constraints, such as available ATE resources and the design of the probe card, heads and tips, conventional ATE testing is carried out by mapping resources from the ATE onto individual dies on a wafer (or individual packaged parts in final test, where the dies/packaged parts are similarly referred to as DUTs), where all DUTs are tested identically.

Accordingly, a given test executes on all N/M DUTs where, as above, N/M is the multi-site factor (assuming no additional probe card routing constraints). However, the ATE does not necessarily include an equal number of each type of resource. As a result, the multi-site factor is determined by the resource that is least available from the ATE (i.e., the maximum count of the most constrained resource). Examples of such resource limitations include number of analog channels, number of data logging channels, number of high speed interface channels, number of clock channels, and the like. Although higher parallelism is available for ATE resources greater in number, overall test throughput is impeded by the ATE resources that are lower in number, which results in a longer testing time.

DETAILED DESCRIPTION OF EXAMPLE EMBODIMENTS

In this description, the term "couple" or "couples" means either an indirect or direct wired or wireless connection. Thus, if a first device couples to a second device, that connection may be through a direct connection or through an indirect connection via other devices and connections.

To address the above problems, examples of this description are directed to systems and methods for testing multiple dies on a semiconductor wafer. For example, a scribe line refers to the space between dies on a wafer where a saw can safely cut the wafer without damaging the dies or circuits implemented on the wafer. Conventionally, the scribe line is a non-functional spacing that merely serves to ensure that a saw (e.g., a mechanical saw, a laser-based saw, or other known device for separating dies on a wafer) is able to effectively cut between the dies or circuits.

However, in accordance with examples of this description, a landing pad and an interconnect coupled to the landing pad are implemented in a scribe line of a wafer. The interconnect couples the landing pad to a cluster of dies on the wafer. A tip of a probe head contacts the landing pad during testing to provide an electrical connection between the probe head and the cluster of dies. Subsequently, the cluster of dies is tested using automated test equipment (ATE) that includes multiple resources as described above, which are applied to the cluster of dies (referred to collectively as a device under test (DUT)) via the landing pads. In this way, the scribe line is used to create landing pads and interconnects that allow a single probe tip to fan out, or electrically contact, a cluster of dies rather than a single die. This results in an increase in the attainable multi-site factor, depending on how many dies an interconnect couples a single landing pad to.

For example, a multi-site factor is conventionally given by N/M as described above (where N is the number of a particular available ATE resource and M is the number of resources of that type required to test a die). However, examples of this description increase the multi-site factor by a factor of L, where L is the number of dies in the cluster contacted by the scribe line-implemented interconnect and the landing pad coupled thereto. So in a case where a landing pad is implemented in the scribe line and coupled to a die cluster of size 4 through an interconnect also implemented in the scribe line, the multi-site factor is boosted to 4*N/M, which results in an increase in test throughput and corresponding decrease in time required to test all the dies on a wafer of a given size.

Examples of this description are not necessarily limited to implementing only a single landing pad and interconnect on a scribe line of a wafer. Rather, multiple landing pads and interconnects may be implemented on scribe lines between dies, such as by employing tunneling to provide scribe-to-die connectivity across different layers. In these examples, multiple probe tips may each contact a different landing pad in the scribe line during a single touch-down, improving the fan out of ATE resources across the wafer. In fact, in some examples, all of the dies contained on a single wafer may be coupled to landing pads accessible by the probe head in a single touch-down, which may permit a test to be concurrently performed on all the dies of a wafer. The number of dies of a wafer that are testable during a single touch-down may vary in practice, such as based on restrictions of available ATE resources, location of probe heads mounted on the probe card, and the size of die clusters.

In addition to interconnects between a landing pad and a cluster or plurality of dies, the scribe line may also include one or more die-to-die connections. These die-to-die connections allow one die to test another die. In these examples, dies may be classified as a master (i.e., the die applying the test) or a slave (i.e., the die being tested) and as functional (i.e., enabling testing using functions implemented on the die) or sacrificial (i.e., enabling testing using test-only functions). Sacrificial dies can additionally provide landing pads, improved routing between dies, and other embedded design for testability (DFT) elements to aid in test application and response measurement (e.g., a voltage regulator for providing a reference voltage, current measurement using current mirrors and resistors, built-in self-test (BIST) controllers, and the like). Further, in some examples, DFT structures such as measurement units (e.g., resistor dividers, low-cost analog-digital converters (ADCs), and flash BIST controllers) may be implemented in the scribe line, enabling measurements on individual dies to be carried out locally as opposed to being made using ATE resources.

In certain examples of this description, one or more switches may be implemented on signal and/or power connections, either in a scribe line or within a die itself. These switches permit selective connectivity between components (e.g., landing pads, DFT structures, and the dies themselves), which may assist in the isolation of a die or dies identified as being faulty during an earlier testing procedure.

Examples of this description thus allow for wafer probing with an improved multi-site factor, within the restrictions of available ATE resources, by enabling probe heads mounted on the probe card to cover or "fan out" to an increased number of dies or die clusters. In certain examples, in fact, all dies on a wafer may be tested with a single touch-down event, due to implementing interconnects and landing pads within the scribe line.

Figure 1:
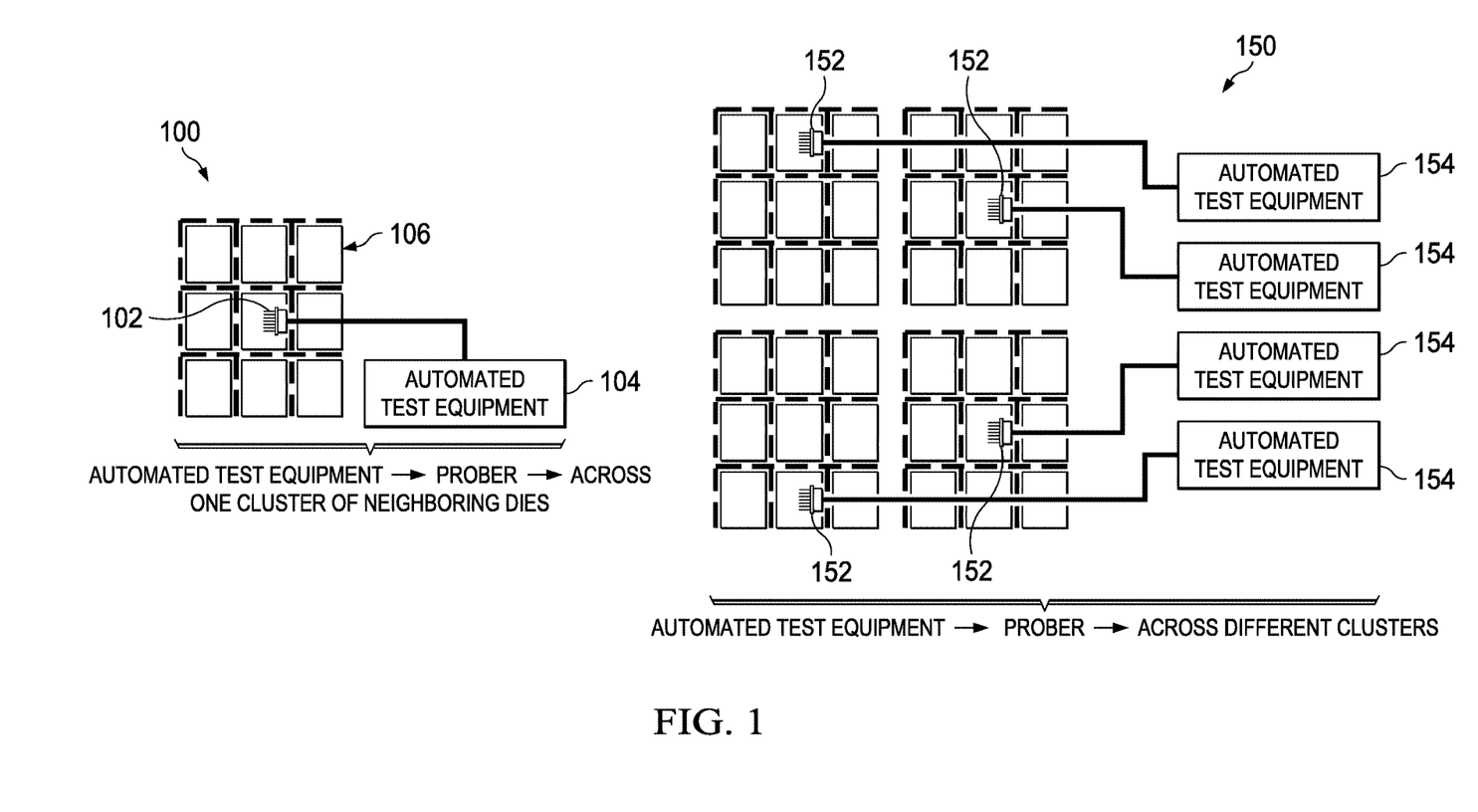
FIG. 1 shows a schematic of die clusters on a wafer in accordance with various examples of this description.

FIG. 1 shows schematic examples of contacting dies on a wafer. In the first example 100, a prober 102 (generally referring to the combination of one or more probe tips on a probe head) is driven by an ATE 104. The prober 102 is an electromechanical assembly that transmits electrical signals from the ATE 104 to an electrical contact on the wafer. In the example 100, the mechanical prober 102, driven by the ATE 104, is configured to test a grouping of nine dies 106 in a single touch-down event. Achieving a high degree of parallelism in testing dies 106 is limited by the fact that the ATE 104 has a finite number of electrical resources (or pins).

To illustrate this limit, in the second example 150, four separate probers 152 are each driven by a dedicated ATE 104, and thus a grouping of 36 dies may be tested in a single touch-down event. However, this requires four times the resources of the first example 100—or four ATEs 154—to implement, which is not ideal. Alternatively, one ATE 154 may drive four probe heads 152, although ATE 154 resources may be constricted and thus not all 36 dies may be tested concurrently. Further, it may be desirable to reduce the number of probe heads 152 as well. The probers 102, 152 may include multiple probe heads, each probe head in turn including multiple probe tips; however, the examples 100, 150 are for illustrative purposes to demonstrate the limitations when attempting to expand the parallelism of testing in conventional scenarios.

Figure 2A:
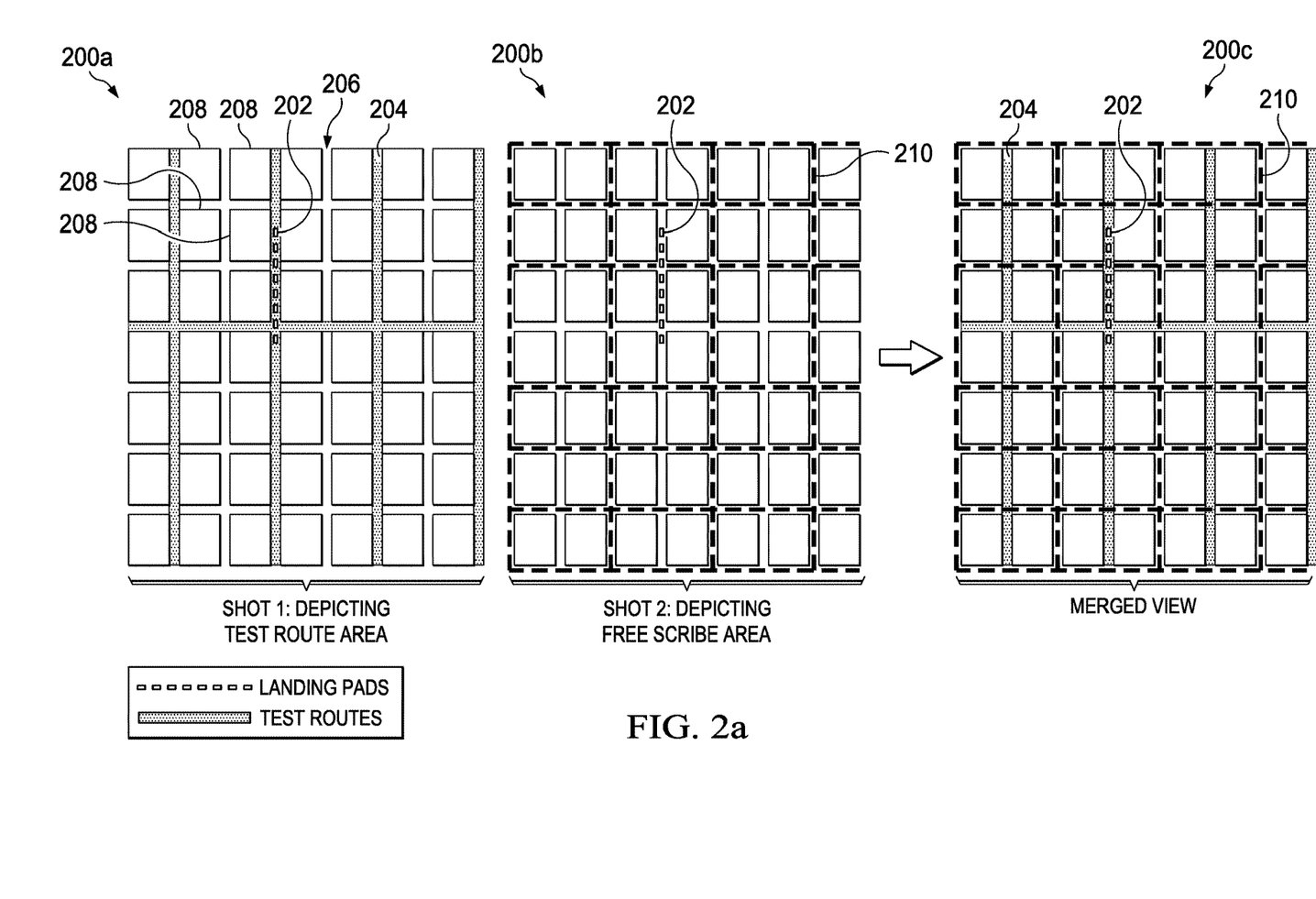
FIGS. 2a-2b shows a schematic of landing pads implemented in a scribe line on a wafer in accordance with various examples of this description.

Conventionally, landing pads are located on each of the various dies of a wafer (i.e., the landing pads are the pads of the particular die). To address this limitation, FIG. 2a illustrates a semiconductor wafer 200 in accordance with examples of this description, in which landing pads 202 and interconnects 204 are positioned in one or more scribe lines 206 between dies 208 of the wafer 200. The view 200a depicts landing pads 202 coupled to test routes or interconnects 204 in portions of the scribe line area 206. The view 200b depicts the remaining free scribe area 210, along with the landing pads 202 for reference. The view 200c depicts the merging of the landing pads 202, the interconnects 204, and the free scribe area 210.

Figure 2B:
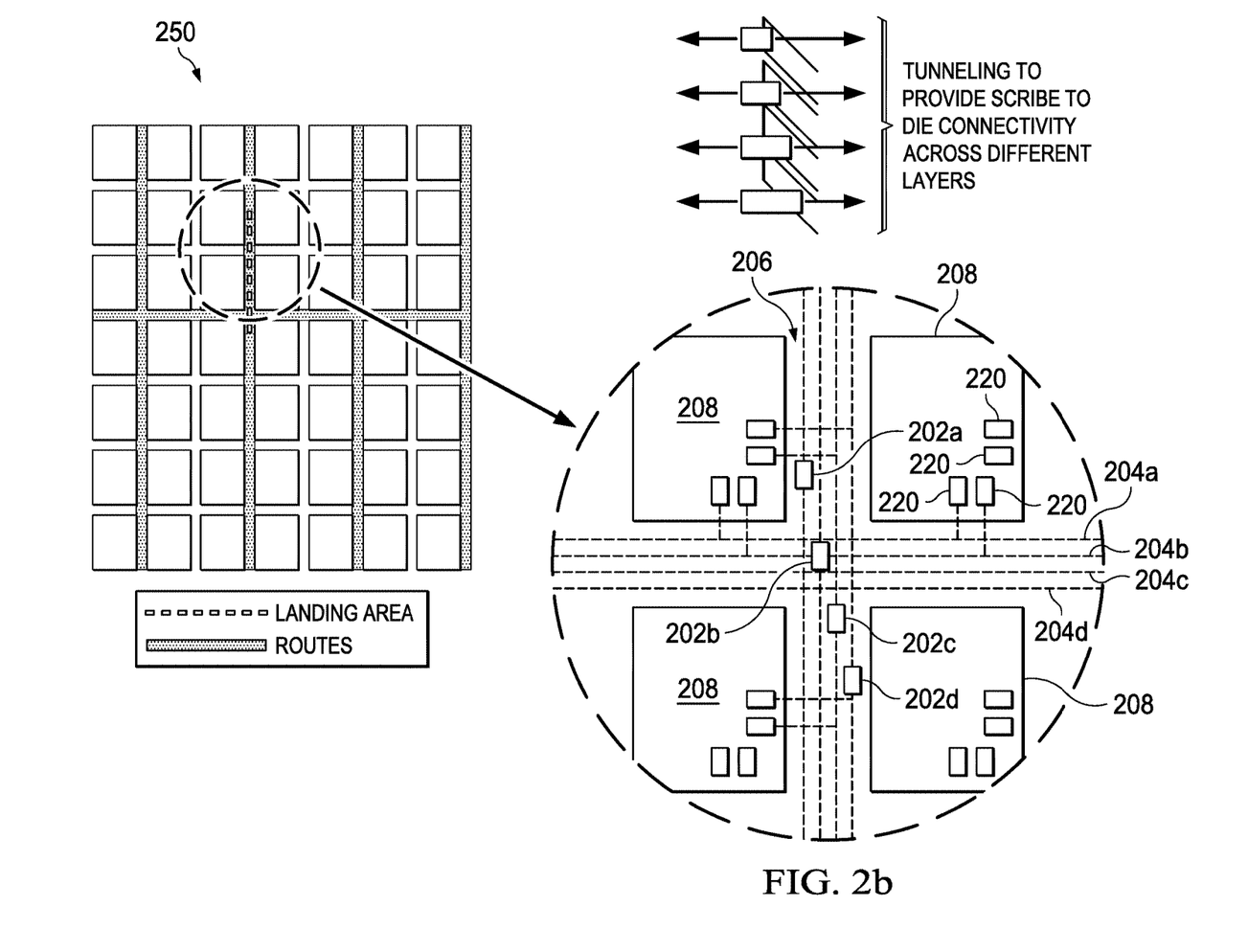

FIG. 2b illustrates the landing pads 202 and the interconnects 204 in the scribe lines 206 of FIG. 2a in greater detail. For example, multiple landing pads 202a-d are shown in the scribe line 206. In this example, it may be assumed that each pad 202a-d corresponds to a different ATE resource needed to test a die 208. Each landing pad 202a-d is coupled to a corresponding interconnect 204a-d, respectively, which provides routing to the dies 208. As shown, the dies 208 also include pads 220, which would conventionally be used to make electrical contact with the dies 208.

However, as described above, contacting the pads 220 limits the amount of parallelism in testing dies 208 that may be achieved. In contrast, examples of this description improve the parallelism in testing the dies 208 by utilizing (in the shown example of FIG. 2b) one pad 202a-d to contact four different dies 208. Thus, in one example where a prober 102 only contains four pins, each of a different, required ATE resource type, the example shown in FIG. 2b allows four dies 208 to be tested in a single touch-down event. Conventional wafers and testing systems and methods would require four separate touch-down events, one to test each of the dies 208 shown.

FIG. 2b is an example, and the scope of this description is not limited to a 2×2 tile arrangement (nor a 7×7 tile arrangement as shown in the expanded view 250). Rather, FIG. 2b illustrates the improvements to parallelism in testing the dies 208 enabled by examples of this description in which landing pads 202 and interconnects 204 are positioned in the scribe line 206 to "fan out" to a number of dies 208 in the area. The number of landing pads 202 and interconnects 204 able to be positioned in the scribe line 206 may vary based on the width of the scribe line 206, the width of the interconnects 204 (e.g., signal lines may be narrower, while interconnects 204 carrying a higher current may be thicker). Additionally, tunneling may be employed to enable scribe-to-die connectivity across different layers of the scribe line 206, as shown by the four interconnects 204a-d in FIG. 2b.

Figure 3:
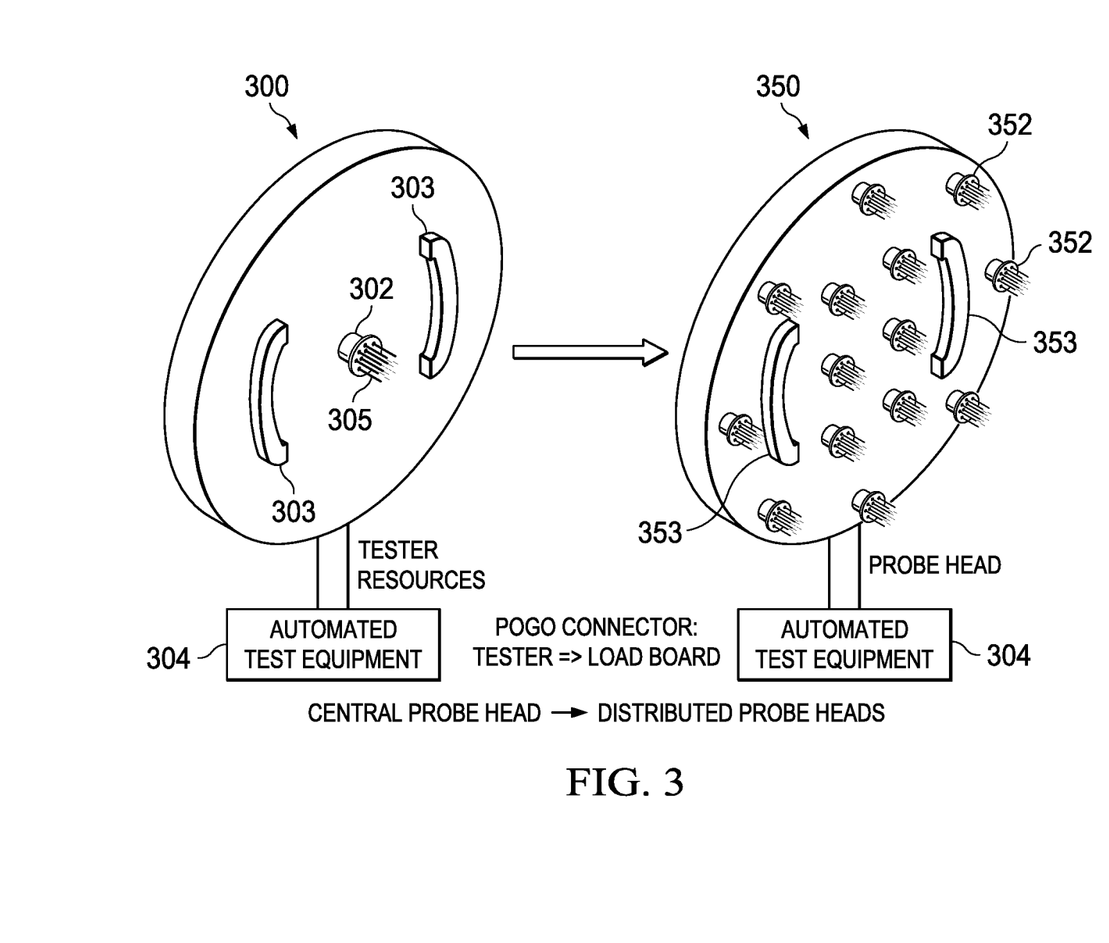
FIG. 3 shows an example probe head configuration in accordance with various examples of this description.

FIG. 3 illustrates a distributed probe head configuration relative to a single probe head configuration. For example, FIG. 3 shows two example probe heads 300, 350 in accordance with this description. The probe head 300 contains a single prober 302 and pogo connectors 303 (or other spring-loaded devices to allow for compliance when contacting a wafer). The prober 302 includes a plurality of pins 305 that provide electrical connectivity between ATE resources 304 and a pad on the wafer when in contact. The probe head 350 includes similar pogo connectors 353 and several probers 352, which can thus land on a wafer in multiple locations. In some examples, depending on the prober 300, 352, the probe head 302, 352 configuration, how the wafer is laid out, how much current is required to test each die on the wafer, how many pads are required to test each die, the entire wafer may be tested in a single touch-down event because the probers 302, 352 and associated pins (e.g., pins 305) may be "fanned out" across multiple dies as described above.

Figure 4A:
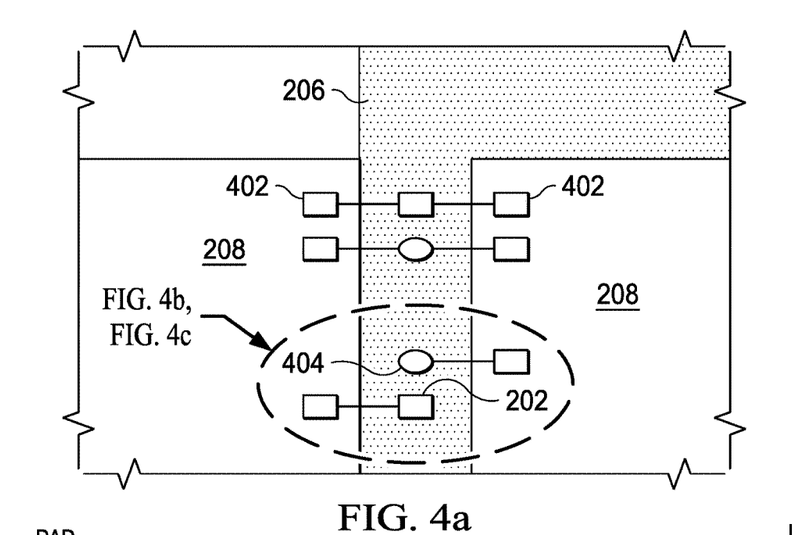
FIGS. 4a-4c show example switch configurations for connecting to or isolating dies on a wafer in accordance with various examples of this description.

FIG. 4a illustrates example switch configuration or topology for connecting to and/or isolating individual (or clusters of) dies. FIG. 4 shows a scribe line 206 between two dies 208, similar to those described above with respect to FIG. 2a. Further, the scribe line contains landing pads 202, depicted as rectangular elements. In addition, the dies 208 themselves contain landing pads 402, which may be used before or after the scribe line 206 has been cut. As shown, the landing pads 202 in the scribe line 206 may couple to one or more dies 208 as described above. The scribe line 206 also includes internal connections 404 that enable connectivity between the scribe 206 and the die 208, but are not landing pads 202. The internal connection 404 may comprise a logic element such as a resistor divider, design for testability (DFT), or the like, which may be used to drive one or more of the surrounding dies 208. Alternatively, the internal connection 404 may be more "simple" and merely present a metal-to-metal connection between different layers of the scribe line 206 (e.g., between different interconnects, described above with respect to FIG. 2a).

Figure 4B:
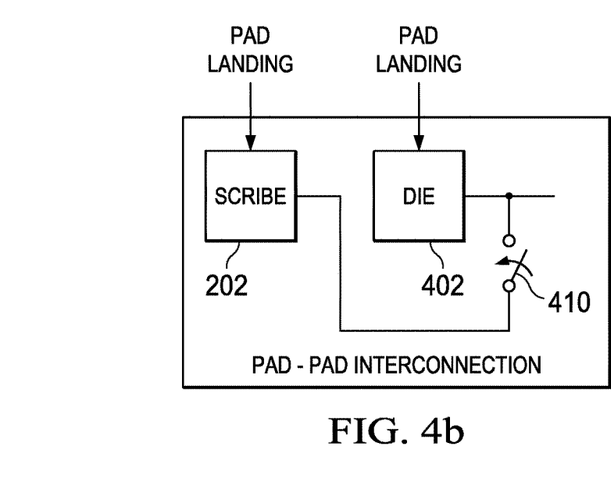

FIG. 4b demonstrates that pad landings may occur on either the landing pad 202 on the scribe line 206 or a landing pad 402 on the die itself. For example, the landing pad 202 may be used during a wafer test, whereas the landing pad 402 may be utilized after the pad of the die 208 is, for example, bonded to a wire to be placed into a packaged part. Further, a switch 410 may allow for isolation of this particular die 208 from the landing pad 202 in the event that the particular die 208 fails a test, but the remaining dies 208 in its cluster are still to be tested.

Figure 4C:
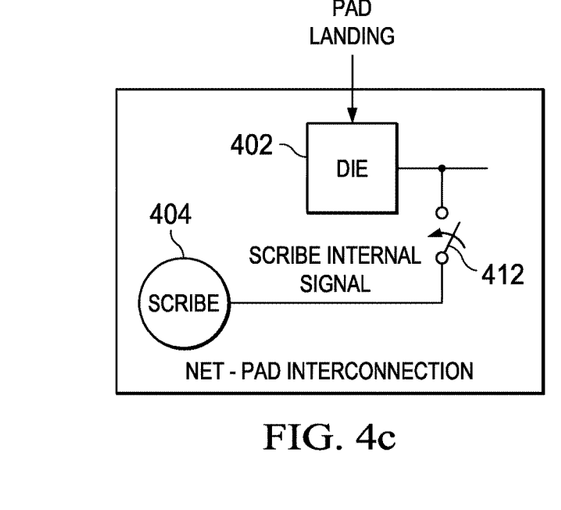

FIG. 4c demonstrates a landing pad 402 only on a die, which is coupled to an internal connection 404 by way of a switch 412. Inclusion of the landing pad 402 on the die is beneficial so that the die may be tested even after the scribe line is sawed through. As described above, the internal connection 404 may comprise a logic element or may simply provide a connection to another layer of the scribe line 206, such as to couple to another landing pad or die. Thus, even in the example shown in FIG. 4c, although a landing pad 202 itself is not implemented in the scribe line 206, testing of the die 208 and surrounding dies may be improved through their access to a common logic element 404 in the scribe line 206, which would not otherwise be present. Either of the switches 410, 412 may be operated, so that after a die 208 is identified as bad or faulty, that die may be isolated from power and input signals or, in the case of 412, isolated from access to the logic resource or connection 404.

Figure 5:
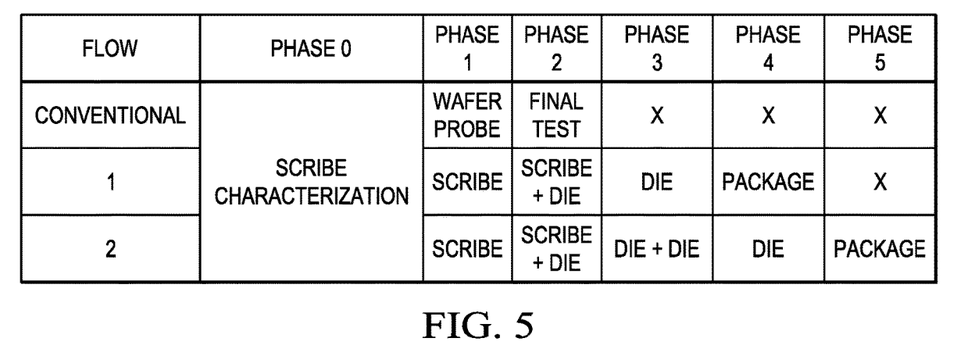
FIG. 5 shows example test flows in accordance with various examples of this description.

FIG. 5 illustrates various example wafer probe test flows in accordance with examples of this description. From the outset, it is noted that the "phases" corresponding to columns of the table do not necessarily relate to the time taken to perform the phase. Rather, the phases are intended to show the possible steps that may be taken during a particular test flow.

With respect to all test flows, a phase 0 scribe characterization test is carried out, which is an electrical test that occurs before actual testing of the individual dies on the wafer. Accordingly, upon manufacture of the wafer, a so-called wafer health flow is performed to ensure that the wafer as a whole meets basic requirements. Subsequent to this phase 0 step, the various test flows may differ.

For example, in the conventional test flow, the first phase includes probing of the dies on the wafer in a conventional manner, such as contacting landing pads on the dies with the probe head and applying ATE resources to those contacted dies. This process may be repeated a number of times until all the dies on the wafer have been suitably tested. Then, the second phase comprises a final test, which may include a test of a die integrated as a packaged part.

However, in accordance with examples of this description, test flows 1 and 2 begin with a test of the scribe itself. For example, because examples of this description utilize the scribe for connectivity—a landing pad to fan out to multiple dies by way of various interconnects and/or other internal connections such as logic elements—the scribe itself is tested before beginning testing of any of the associated cluster of dies. Both of test flows 1 and 2 then proceed to test both the scribe and dies, such as using the fanned out scribe-implemented landing pads described above. The fanning out of the scribe-implemented landing pads permits a higher multi-site than would otherwise be achievable within the context of a single touch-down event.

Test flow 1 continues in phase 3 to test the dies themselves (again, using the fanned out scribe-implemented landing pads in certain examples), while test flow 2 includes an optional step of testing a die-to-die connection; test flow 2 also then proceeds to test the dies themselves. After the dies have been tested, both test flows 1 and 2 may proceed to testing dies in the context of being a packaged part.

The above-described examples improve upon the attainable multi-site factor by fanning out a single landing pad to a plurality of dies, increasing the number of dies reachable in a single touch-down event. In some cases, the method used for testing dies includes mapping ATE resources onto individual dies or DUTs on the wafer or DUTs as packaged parts in a final test. However, it may be that all DUTs are tested identically; accordingly, a same given text executes on all the DUTs being tested at a given time based on the multi-site factor of the particular testing system, which may waste certain resources. For example, resources required exclusively for "Test B" are unutilized while "Test A" is carried out. As a result, the overall system multi-site factor is determined by the ATE resource that is least available (i.e., the maximum count of the most constrained ATE resource). Examples of ATE resources include analog channels, digital channels, data logging channels, high-speed interface channels, clock channels, and the like. Commonly, an equivalent number of each resource is not available, which leads to the multi-site factor constraint described above.

Thus, although higher parallelism is available for ATE resources that are greater in number, the overall test throughput (which requires multiple resources to be applied) may still be somewhat impeded by the constrained number of ATE resources. Accordingly, for constrained ATE resources, the test time increases as tests across multiple DUTs are carried out serially. However, in developing the various examples of this description, it was determined that a typical maximum ATE resource utilization is approximately 70%. Accordingly, across different applications of tests in a test schedule that utilize a varying set of ATE resources for different tests in the schedule, approximately only 70% of the ATE resources are used on average across the time duration required to run all the tests in the test schedule.

To address these issues, certain examples of this description may test multiple DUTs (e.g., dies on a wafer or packaged parts) using available ATE resources (or resources from similar test processing equipment) with different tests being applied to different DUTs at the same time. For example, different DUTs are tested using different tests (or different ATE resources) at the same time, which results in a summing of ATE resources that are able to be applied at one time. For example, due to physical constraints (e.g., the arrangement of probe heads, probe tips, and landing pads), the number of different ATE resources applied to DUTs at the same time may not be the entire sum of the numbers of those ATE resources. For example, if 70 resources of type A and 30 resources of type B are available, physical constraints involved in contacting the wafer or DUTs may result in all 70 resources of type A being applied to certain DUTs, while only 20 resources of type B are applied to other DUTs. Regardless, more resources are applied during a single touch-down event than conventional testing using a single set of resources to apply one test per touch-down event.

For example, multiple DUTs are tested concurrently, although different tests may be applied to different ones of the DUTs at the same time. In the context of testing dies on a wafer, ATE resources are mapped onto different pads on the wafer using various probe head configurations mounted on a probe card. Similarly, in the context of testing packaged parts, ATE resources are mapped onto different packaged device pins on an ATE load board using various routing and relay configurations. The ATE hardware may be configured to allow dynamic allocation of resources connected to various ATE channels to different DUT pads or pins. The particular allocation of ATE resources to the ATE channels is controlled by an internal ATE test program. Thus, examples of this description improve ATE resource utilization by scheduling tests concurrently that leverage otherwise-unused ATE resources. As a result of concurrent testing, overall test throughput is increased while idle ATE resources for a given touch-down event are reduced. The described examples may apply to both ATE-based testing, in which probe cards are used to test dies on a wafer, and board-based testing, in which a load board is used to test packaged dies.

In certain examples of this description, a plurality of dies or DUTs are grouped together to form a "cluster," where each DUT is part of only one cluster. DUTs within a cluster are tested concurrently, and may be tested with different test content (or different applied ATE resources); however, all clusters on the wafer may be identical and tested concurrently. Thus, a cluster may be viewed as a DUT itself, composed of sub-modules each of which is also a DUT (e.g., an individual die). As a result, the ATE interfaces with the clusters, which make up the wafer, all of the clusters being identical and tested with identical content.

The described examples overcome conventional bottlenecks in test time, test throughput, attainable multi-site factor (and thus test concurrency), and resource utilization in various scenarios. For example, where constraints exist due to DUT pins because each DUT offers only a limited number of pins for testing, examples of this description may be leveraged in at least one of two ways. First, the number of DUT pins available for test may be increased. Accordingly, the test mode pin-muxing is relaxed, with different pins contacted for different tests. However, this may complicate the probe head/load board relay designs in order to allocate different ATE resources to different pins of the DUT. Second, the same set of DUT pins may be utilized for application of different tests, where each test may require application of a dedicated pre-amble to internally assign the pins to the relevant module inside the DUT being tested (i.e., apply a pin-muxing preamble). In both the cases, the ATE throughput increases because different ATE resources are used to test different DUTs with different test content.

Figure 6:
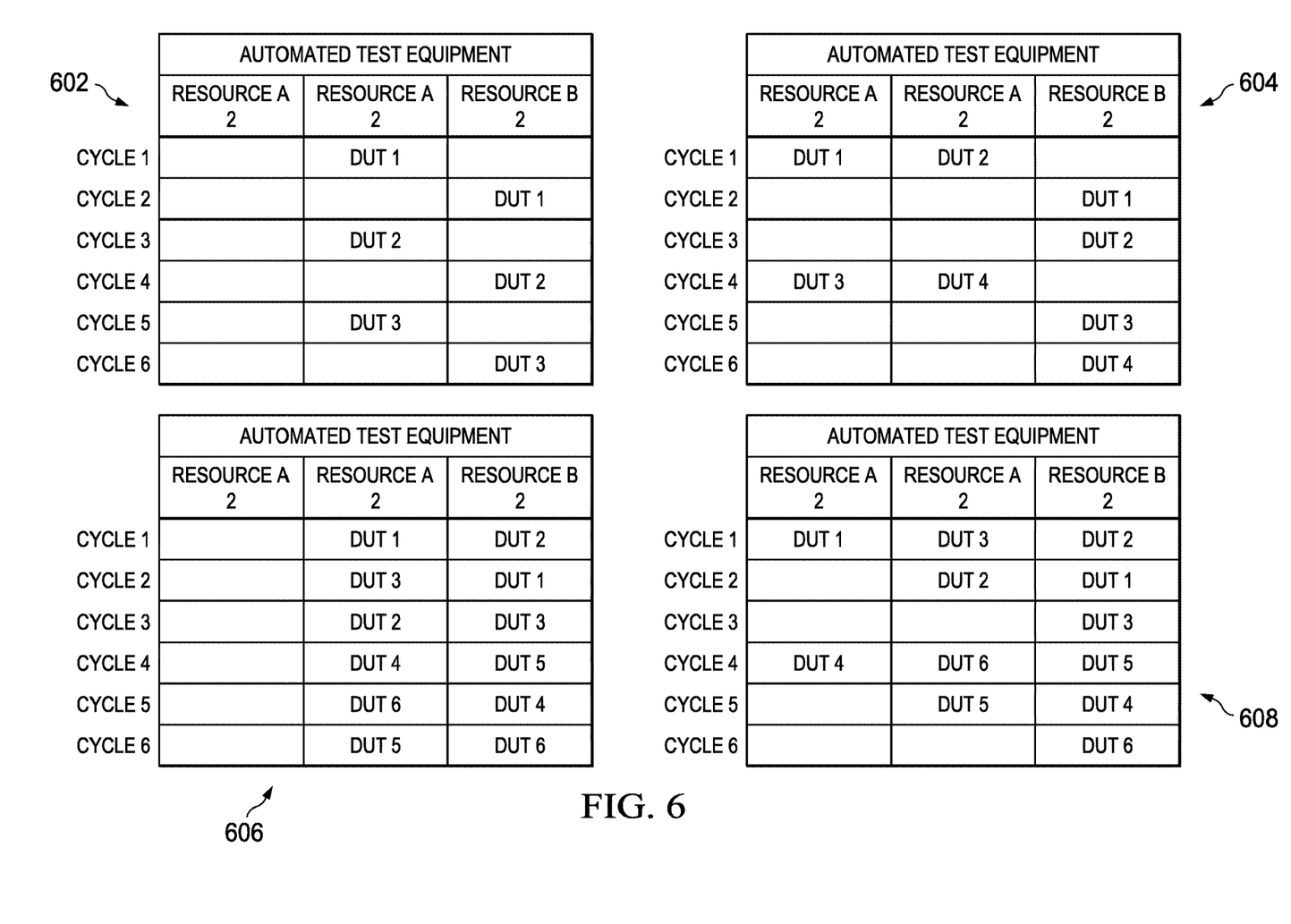
FIG. 6 shows conventional test applications and example multi-content test applications in accordance with various examples of this description.

Referring to FIG. 6, it is assumed for simplicity that each DUT requires two tests, referred to as test A and test B. In order for test A to be carried out on a DUT, two ATE resources of type A are required. Similarly, in order for test B to be carried out on a DUT, two ATE resources of type B are required. The example ATE in FIG. 6 is capable of supplying four resources of type A and two resources of type B. Again, for simplicity, it is assumed that each ATE resource connects to one DUT pin, thus there are 4 pins of resource type A available from the ATE and 2 pins of resource type B available from the ATE.

The example 602 illustrates a conventional test flow, in which only one DUT is capable of being tested with resource B at a time, because only two resources of type B are available, and test B requires two resources of type B. Thus, DUT1 testing is complete in 2 cycles, DUT2 testing is complete in 2 cycles, and DUT3 testing is complete in 2 cycles.

The example 604 illustrates another conventional test flow in which test A is applied to two dies simultaneously (i.e., DUT1 and DUT2 in cycle 1 and DUT3 and DUT4 in cycle 4). This is enabled by the fact that there are four ATE resources of type A available, but test A only requires two resources of type A. However, because the amount of resources of type B is constrained, then the application of test B to the DUTs must occur serially.

In accordance with examples of this description, examples 606 and 608 improve upon the conventional test flows 602 and 604 by applying dissimilar test content to different DUTs concurrently. In the example implementation 606 during cycle 1, test A is applied to DUT1 and test B is applied to DUT2. Continuing on, during cycle 2, test A is applied to DUT 3 and test B is applied to DUT1, while in cycle 3, test A is applied to DUT2 and test B is applied to DUT3. Thus, in the first three cycles, tests A and B have been applied to three DUTs. Cycles 4-6 are similarly used to apply tests A and B to DUTs 4-6. Note that in the example 606, the same test is never concurrently applied to multiple DUTs (i.e., test A because that is the only test capable of concurrent application to more than one DUT). Importantly, however, different types of tests (i.e., test A and test B) are concurrently applied to different DUTs in the same cycle, resulting in the improvement of testing efficiency over conventional examples 602 and 604.

Example 608 presents similar benefits relative to example 606. However, the test flow illustrated by the example implementation 608 demonstrates additional benefits that may be achieved by the multi-content testing described herein. For example, because there are four resources of type A and applying test A only requires two resources of type A, during cycle 1, test A is applied to both DUT1 and DUT2 and test B is applied to DUT2. Then, during cycle 2, test A is applied to DUT2 (completing DUT2's test process) and test B is applied to DUT1 (completing DUT1's test process). Finally, during cycle 3, test B is applied to DUT3. Cycles 4-6 are similarly utilized for DUTs 4-6. Thus, as was the case with example 606 described above, in the first three cycles, tests A and B have been applied to three DUTs.

However, as illustrated in example 608, it can more easily be seen that resource A is idle for effectively three cycles' worth of time (i.e., over the three cycles required to test three DUTs). Certain real-world examples may take advantage of this, such as where a DUT requires an additional test A' that also utilizes resource of type A, or where test A requires additional time to complete relative to test B (e.g., double the time of test B in example 608).

Figure 7:
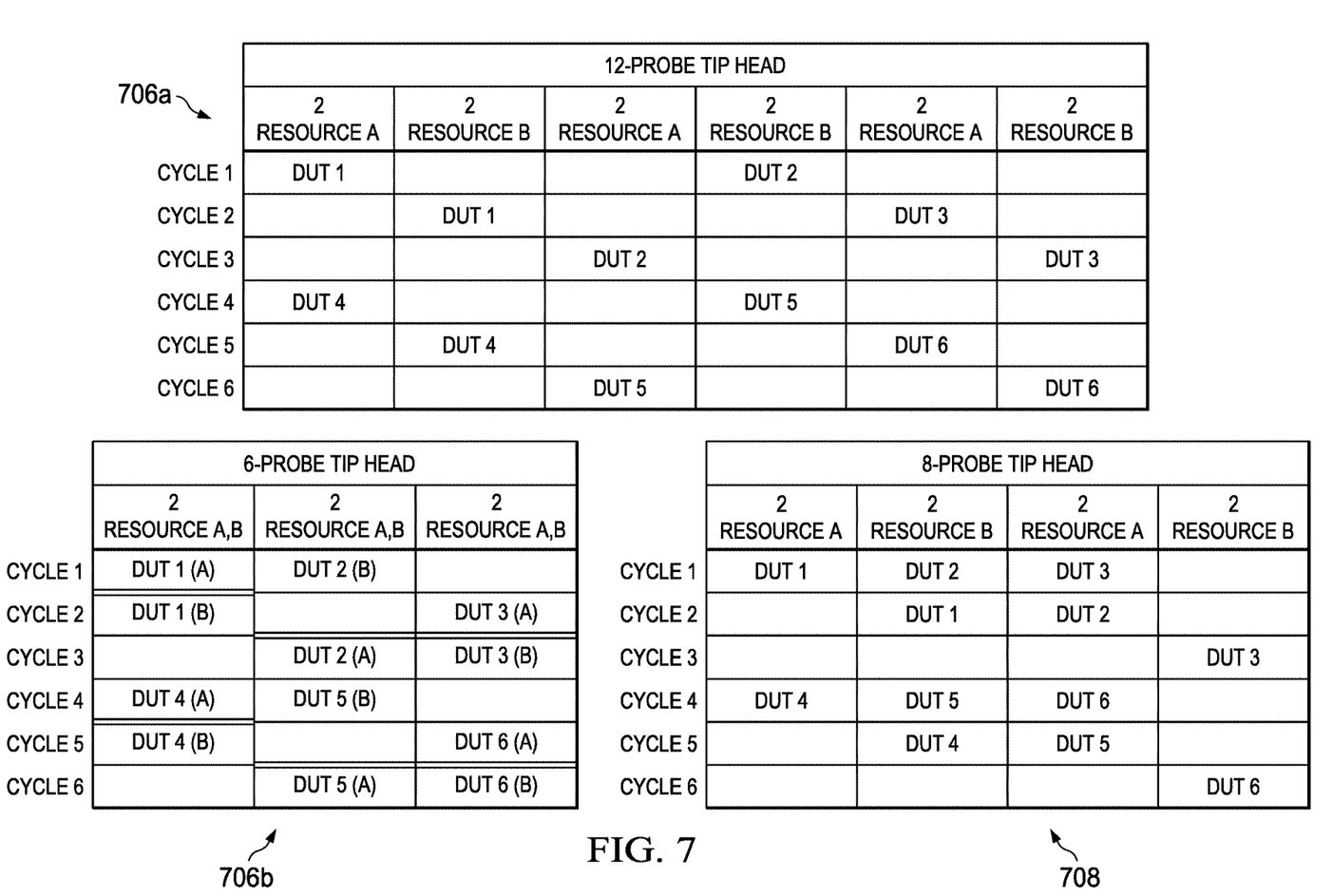
FIG. 7 shows example probe head configurations for carrying out multi-content test applications in accordance with various examples of this description.

FIG. 7 shows various configurations of probe heads, having varying numbers of probe tips, that may be used to perform the multi-content test in accordance with this description. The example configuration 706a shows one way that the test of example 606 above may be carried out using a probe head having 12 probe tips. For example, each DUT has four probe tips dedicated to that die: two to deliver resources of type A and two to deliver resources of type B.

The example configuration 706b represents certain examples in which the size of the probe head can be reduced, in this case to a probe head having six probe tips. Each pair of probe tips is dedicated to a DUT, and thus resources of type A and type B are mapped to the same pins of that particular DUT. In this example 706b, a pin-muxing preamble is applied (notated by a double boundary between cycles) to inform the DUT that the ATE is about to switch from application of resources of type A to application of resources of type B (or vice versa in the case of DUT2). This improves the efficiency because eight pins were unused every cycle in 706a, whereas only two pins are unused every cycle in 706b.

The example configuration 708 represents certain examples in which the probe head may be somewhat reduced in size, but rather than utilizing a pin-muxing preamble as in the example 706b, the probe head itself may be moved between cycles to contact different pins of the DUTs. This reduction in the number of probe pins is achieved by assigning idle probe pins during the testing of one die to the testing of a neighboring die. This is feasible when the topology of the pins within the die has a similar pattern to the topology of the pins across two neighboring dies.

Figure 8:
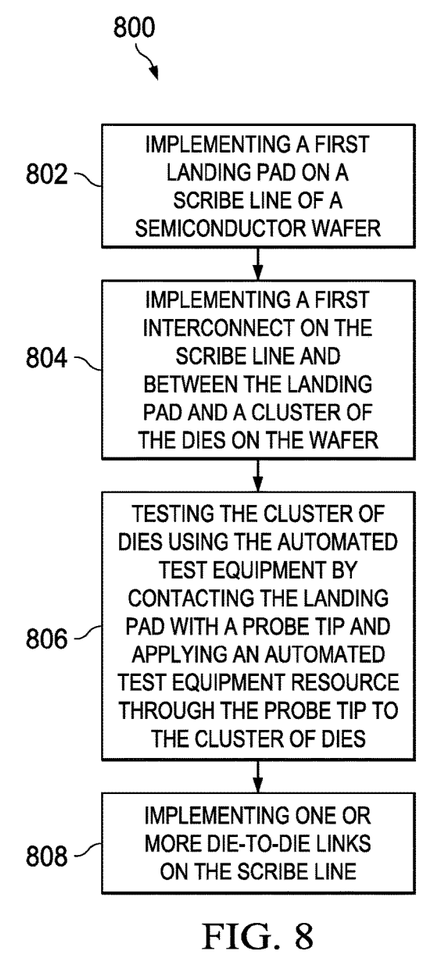
FIG. 8 shows a flow chart of a method in accordance with various examples of this description.

FIG. 8 shows a method 800 in accordance with examples of this description. The method 800 begins in block 802 with implementing a first landing pad on a scribe line of a semiconductor wafer including a plurality of dies. The method 800 continues in block 804 with implementing a first interconnect on the scribe line and between the landing pad and a cluster of the dies on the wafer. As described above, by implementing such an interconnect between a scribe-based landing pad and a cluster of dies, a single probe tip may be used to apply an ATE resource to multiple dies due to the fact that the interconnect fans out from the landing pad to the cluster of dies. This improves the attainable multi-site factor for a given touchdown event. Thus, the method 800 also continues in block 806 with testing the cluster of dies using the ATE by contacting the landing pad with the probe tip and applying an ATE resource through the probe tip to the cluster of dies.

In some cases, the method 800 may continue in block 808 with implementing one or more die-to-die links on the scribe line, which enables one die to test another die by way of the die-to-die link. For example, a receiver circuit of one die can be used to test a transmitter circuit of a neighboring die, and vice versa. In addition to enabling a wider variety of testing flows, this may also help reduce the dependency on the ATE for transmitter-receiver testing.

In examples, additional landing pads and interconnects may be implemented on the scribe line to enable testing of additional cluster(s) with another probe tips coupled to the ATE in a single touchdown event. In certain other examples, the landing pads, interconnects, and probe tips may be configured in a way that enables all of the dies on the wafer to be tested concurrently in a single touchdown event.

During testing of the one or more clusters, the ATE may monitor a response from the dies as a result of the application of the ATE resource. Further, the testing may indicate the presence of a bad die in one or more of the clusters, which may be isolated (e.g., for further testing or discarding). In some cases, the bad die may be isolated by operating a programmable switch to decouple that die from the rest of the cluster. However, in other cases, such as where such switches are unavailable or where efficiency or timing constraints require, the cluster containing the bad die may be discarded and testing on other clusters of dies on the wafer is carried out.

Figure 9:
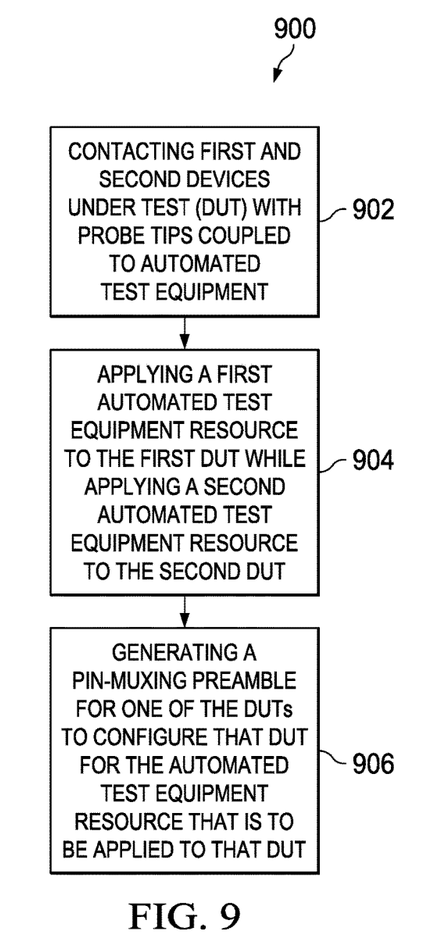
FIG. 9 shows a flow chart of another method in accordance with various examples of this description.

FIG. 9 shows another method 900 in accordance with examples of this description. The method 900 begins in block 902 with contacting first and second devices under test with probe tips coupled to ATE. Devices under test may comprise dies on a wafer, clusters of dies on a wafer, packaged parts, and the like. Further, where the device under test comprises a cluster of dies on a wafer, the contact may be by way of a landing pad implemented on a scribe line and a coupling interconnect, as described above. In certain cases, the devices under test may each comprise a cluster of packaged parts that is coupled to pins on the probe head using routing on an ATE hardware board. The method 900 continues in block 904 with applying a first ATE resource to the first device under test while applying a second ATE resource to the second device under test. As described above, in certain cases the ATE lacks a sufficient amount of one of the resources to apply that resource to the first and second devices under test concurrently. Thus, but controlling the ATE such that different resources are applied to different devices under test concurrently, an increased test throughput is enabled by utilizing resources that conventionally are wasted.

In certain cases, the method 900 further continues in block 906 with generating a pin-muxing preamble for one of the devices under test to configure that device under test for the ATE resource that is to be applied to that device under test. In this way, multiple types of resources may be mapped to the same pin of a device under test, while allowing for configuration of that pin before the application of a different resource type.

In this description, various examples use particular probe head designs, probe tip numbers, pin constrictions on DUTs, and the like. However, the scope of this description is not limited to any of the particular implementation details, but rather is intended to encompass the general techniques described herein.

Modifications are possible in the described embodiments, and other embodiments are possible, within the scope of the claims.

What is claimed is:

1. A semiconductor wafer comprising:
   a first die;
   a second die spaced apart from the first die;
   a scribe line space between facing sides of the first and second dies;
   a pad in the scribe line space; and
   an interconnect in the scribe line space, the interconnect extending along at least an entire length of the facing sides of the first and second dies, in which the pad is electrically coupled through the interconnect to at least one of the first or second dies.

2. The semiconductor wafer of claim 1, wherein the pad is a probe tip landing pad.

3. The semiconductor wafer of claim 1, wherein the pad is electrically coupled through the interconnect to both of the first and second dies.

4. The semiconductor wafer of claim 1, wherein the pad is a probe tip landing pad electrically coupled through the interconnect to both of the first and second dies.

5. A semiconductor wafer comprising:
- a first die;
- a second die spaced apart from the first die;
- a third die spaced apart from the first and second dies;
- a first scribe line space between facing sides of the first and second dies, and between the second and third dies;
- a second scribe line space between facing sides of the first and third dies, and between the second and third dies;
- a first interconnect in the first scribe line space, the first interconnect extending along at least an entire length of the facing sides of the first and second dies;
- a second interconnect in the second scribe line space, the second interconnect extending along at least an entire length of the facing sides of the first and third dies; and
- a pad in at least one of the first or second scribe line spaces, in which the pad is electrically coupled through at least one of the first or second interconnects to at least one of the first, second or third dies.

6. The semiconductor wafer of claim 5, wherein the pad is a probe tip landing pad.

7. The semiconductor wafer of claim 5, wherein the pad is electrically coupled through at least one of the first or second interconnects to at least two of the first, second or third dies.

8. The semiconductor wafer of claim 5, wherein the pad is a probe tip landing pad electrically coupled through at least one of the first or second interconnects to at least two of the first, second or third dies.

\* \* \* \* \*